United States Patent
Schafferer et al.

(10) Patent No.: US 9,281,788 B2
(45) Date of Patent: Mar. 8, 2016

(54) ALL DIGITAL ZERO-VOLTAGE SWITCHING

(71) Applicant: ANALOG DEVICES, INC., Norwood, MA (US)

(72) Inventors: Bernd Schafferer, Amesbury, MA (US); Bing Zhao, Andover, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/201,845

(22) Filed: Mar. 8, 2014

(65) Prior Publication Data

US 2014/0269979 A1    Sep. 18, 2014

Related U.S. Application Data

(60) Provisional application No. 61/799,723, filed on Mar. 15, 2013, provisional application No. 61/787,733, filed on Mar. 15, 2013, provisional application No. 61/801,549, filed on Mar. 15, 2013, provisional application No. 61/867,233, filed on Aug. 19, 2013.

(51) Int. Cl.
*H04K 1/02* (2006.01)
*H04L 25/03* (2006.01)
(Continued)

(52) U.S. Cl.
CPC ............ *H03F 3/2175* (2013.01); *H03F 1/3241* (2013.01); *H03F 3/2176* (2013.01)

(58) Field of Classification Search
CPC .... H03F 3/2175; H03F 1/3241; H03F 3/2176
USPC ........................................................ 375/297
See application file for complete search history.

(56) References Cited

U.S. PATENT DOCUMENTS 5,023,566 A    6/1991    El-Hamamsy et al.
5,285,505 A    2/1994    Kim et al.
(Continued)

FOREIGN PATENT DOCUMENTS

EP    1478084 B1    11/2004
EP    2251976       11/2010
(Continued)

OTHER PUBLICATIONS

Extended European Search Report for European Application Serial No. 14158853.3 mailed Oct. 21, 2014, 10 pages.
(Continued)

*Primary Examiner* — Tanmay Shah
(74) *Attorney, Agent, or Firm* — Patent Capital Group

(57) ABSTRACT

Power efficiency is an important design requirement of power amplifiers. To improve power efficiency, a solution proposed in this present disclosure includes an all-digital zero-voltage switching apparatus for directly driving a switching power amplifier through a desired current pulse shape. The apparatus includes a digital engine and a digital-to-analog converter (DAC). The digital engine processes baseband data and generates a digital output. The digital output of the digital engine drives the DAC to generate a digitally controlled current output having that desired current pulse shape. The digitally controlled current output is used to directly drive the switch power amplifier to improve power efficiency. The digitally controlled current output comprising digitally generated current pulses is controlled accurately by the digital engine and the DAC, and thus allows the switching power amplifier to operate optimally with higher power efficiency than conventional power amplifiers.

20 Claims, 9 Drawing Sheets

(51) Int. Cl.
*H04L 25/49* (2006.01)
*H03F 3/217* (2006.01)
*H03F 1/32* (2006.01)

(56) References Cited

U.S. PATENT DOCUMENTS

| | | | |
|---|---|---|---|
| 5,490,223 | A | 2/1996 | Nishimura et al. |
| 5,647,023 | A | 7/1997 | Agazzi et al. |
| 6,304,140 | B1 | 10/2001 | Thron et al. |
| 6,339,399 | B1 | 1/2002 | Andersson et al. |
| 6,614,288 | B1 | 9/2003 | Dagan et al. |
| 6,774,683 | B2 | 8/2004 | Schafferer |
| 6,798,251 | B1 | 9/2004 | Schafferer |
| 6,973,138 | B1 | 12/2005 | Wright |
| 7,903,016 | B1 | 3/2011 | Wyatt |
| 8,009,095 | B2 | 8/2011 | Schlee et al. |
| 8,284,860 | B2 | 10/2012 | Xu et al. |
| 8,351,877 | B2 | 1/2013 | Kim et al. |
| 8,417,200 | B1 | 4/2013 | Gomez et al. |
| 8,618,969 | B2 | 12/2013 | Wyville |
| 8,885,763 | B2 | 11/2014 | Ananthaswamy |
| 8,890,618 | B2 | 11/2014 | Pamarti et al. |
| 2002/0048326 | A1 | 4/2002 | Sahlman |
| 2007/0026823 | A1 | 2/2007 | Eisenhut et al. |
| 2007/0275676 | A1 | 11/2007 | Rofougaran et al. |
| 2014/0125410 | A1 | 5/2014 | Pamarti et al. |
| 2014/0203871 | A1* | 7/2014 | Pamarti et al. ............ 330/251 |

FOREIGN PATENT DOCUMENTS

| | | |
|---|---|---|
| WO | WO 01/10013 | 2/2001 |
| WO | 2013/019819 A2 | 2/2013 |

OTHER PUBLICATIONS

Mazzanti, A. et al., "A 1.4 GHz-2 GHz Wideband CMOS Class-E Power Amplifier Delivering 23 dBm peak with 67% PAE", 2005 IEEE Radio Frequency Integrated Circuits (RFIC) Symposium; Jun. 12-14, 2005; Long Beach, CA, USA, IEEE, Piscataway, NJ, USA, Jun. 12, 2005, pp. 425-428.

U.S. Appl. No. 14/210,304 filed Mar. 14, 2014, 42 pages.
U.S. Appl. No. 14/206,451 filed Mar. 12, 2014, 49 pages.
U.S. Appl. No. 14/222,223 filed Mar. 21, 2014, 52 pages.
Response to Extended European Patent Search Report for EP Application No. 14158853.3 filed Mar. 20, 2015, 17 pages.
DARPA, Broad Agency Announcement, Direct Digital to High Power Analog Conversion Technology (PowerDAC), DARPA Microsystems Technology Office (MTO), DARPA-BAA-11-12, Jan. 13, 2011, 46 pages.
Blog, D1 I/V with 4x TDA1543, http://www.diyaudio.com/forums/pass-labs/196937-d1-i-v-4x-tda1543.html, Pass Labs, Sep. 20, 2011, 4 pages.
Blog, The Pass D1 for TDA1543, http://www.diyaudio.com/forums/digital-line-level/32999-pass-d1-tda15 . . . , Digital Line Level, DACs, Digital Crossovers, Equalizers, etc., Apr. 26, 2004, 6 pages.
Adams, R. "A 3V CMOS 400mW 14b 1.4GS/s DAC for Multi-Carrier Applications", Solid-State Circuits Conference, 2004, Digest of Technical Papers, ISSCC, 2004 IEEE International, Feb. 15-19, 2004, vol. 1, pp. 360-532 (172).
AD9734/AD9735/AD9736—Analog Devices Data Sheet—10-/12-/14-Bit, 1200 MSPS DACS, Rev. A, © 2006 Analog Devices, Inc., 72 pages.
Ajay Kuckreja, "Digital RF Modulators for CCAP," Aug. 20, 2012, www.cedmagazine.com/articles/2012/08/digital-rf-modulators-for-ccap, May 7, 2015, 5 pages.
Dong-U Lee et al., "Hierarchical Segmentation for Hardware Function Evaluation," IEEE Transactions on Very Large Scale Integration (VLSI) Systems, vol. 17, No. 1, Jan. 2009, 1063-8210/$25.00 © 2008 IEEE, pp. 103-116 (14 pages).
Tsutomu Sasao et al., "Numerical Function Generators Using LUT Cascades," IEEE Transactions on Computers, vol. 56, No. 6, Jun. 2007, 0018-9340/07/$25.00 © 2007 IEEE, Published by the IEEE Computer Society, pp. 826-838 (14 pages).
Patent Abstracts of Japan, vol. 14, No. 494, Japan (P-1123), Oct. 26, 1990 & JP-A-02-202689 (Fujitsu Ltd) Aug. 10, 1990, abstract, 1 page.
Patent Abstracts of Japan, vol. 15, N0. 368 (P1235). Japan Sep. 17, 1991 & .TP-A-O3 144788 (Nee Corp) Jun. 20, 1991, abstract, 1 page.

* cited by examiner

ALL DIGITAL ZERO-VOLTAGE SWITCHING

PRIORITY DATA

This non-provisional patent application receives from benefit or claims priority to U.S. Provisional Application 61/799,723 entitled "DUTY CYCLE DETECTION CIRCUIT FOR DOUBLE DATA RATE CONVERTER" and filed on Mar. 15, 2013, U.S. Provisional Application 61/787,733 entitled "DIGITAL SWITCHING" and filed on Mar. 15, 2013, U.S. Provisional Application 61/801,549 entitled "RADIO FREQUENCY (RF) DOMAIN DIGITAL PREDISTORTION (DPD)" and filed on Mar. 15, 2013, U.S. Provisional Application 61/867,233 entitled "HIGH OUTPUT POWER DIGITAL-TO-ANALOG CONVERTER SYSTEM" and filed Aug. 19, 2013. These referenced patent applications are all hereby incorporated by reference.

TECHNICAL FIELD OF THE DISCLOSURE

The present disclosure is in the technical field of radio frequency (RF) power amplifiers. More particularly, the present disclosure is in the technical field of using digital to analog converters (DACs) to control a signal current in a power amplifier to optimize its power efficiency.

BACKGROUND

Power amplifiers (PAs) have many important applications in our electronics today, one of which is the application of power amplifiers in radio frequency transmitters, where a low-power signal is amplified into a larger signal of significant power for driving an antenna of a transmitter. Power amplifiers are one of the weakest links in the transmit signal chain. Many new PA architectures have been developed or rediscovered over the last years to improve the linearity, efficiency, bandwidth, and output power.

Power amplifiers have many classes, such as Class A, AB, B, C, E, or F amplifiers. Class A power amplifiers are the least efficient. Power amplifiers use Class AB, B or C configurations where the power driving transistor is on for a smaller fraction respectively of the complete cycle compared to class A, to improve efficiency. FIG. 1 shows illustrative current waveforms for Class A, AB, B, and C amplifiers. These amplifiers' efficiency depends heavily on the control of the current waveform with respect to the voltage waveform in order to minimize power dissipation. However, solutions for controlling the current waveform have been insufficient to achieve optimal efficiency.

Overview

Power efficiency is an important design requirement of power amplifiers. To improve power efficiency, a solution proposed in this present disclosure includes an all-digital zero-voltage switching apparatus for directly driving a switching power amplifier through a desired current pulse shape. The apparatus includes a digital engine and a digital-to-analog converter (DAC). The digital engine processes baseband data and generates a digital output. The digital output of the digital engine drives the DAC to generate a digitally controlled current output having that desired current pulse shape. The digitally controlled current output is used to directly drive the switch power amplifier to improve power efficiency. The digitally controlled current output comprising digitally generated current pulses is controlled accurately by the digital engine and the DAC, and thus allows the switching power amplifier to operate optimally with higher power efficiency than conventional power amplifiers.

DESCRIPTION OF EXAMPLE EMBODIMENTS OF THE DISCLOSURE

Understanding Power Efficiency of Power Amplifiers and Zero-Voltage Switching

Figure 1:
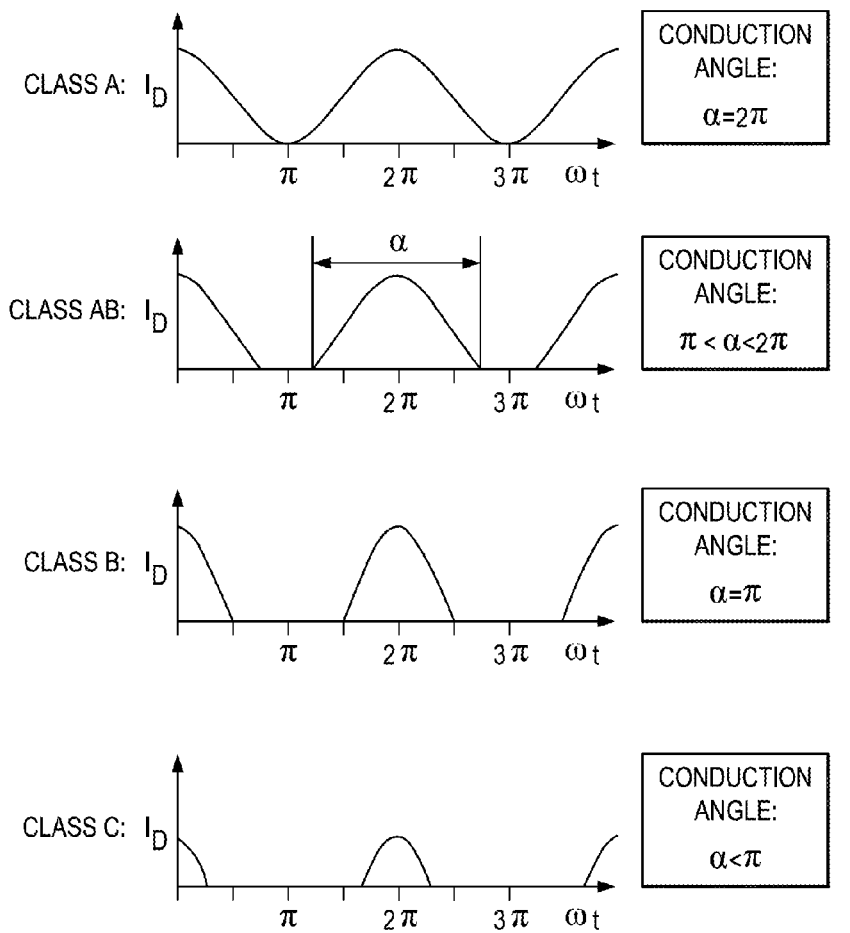
FIG. 1 shows illustrative current waveforms for Class A, AB, B, and C amplifiers.
Figure 2:
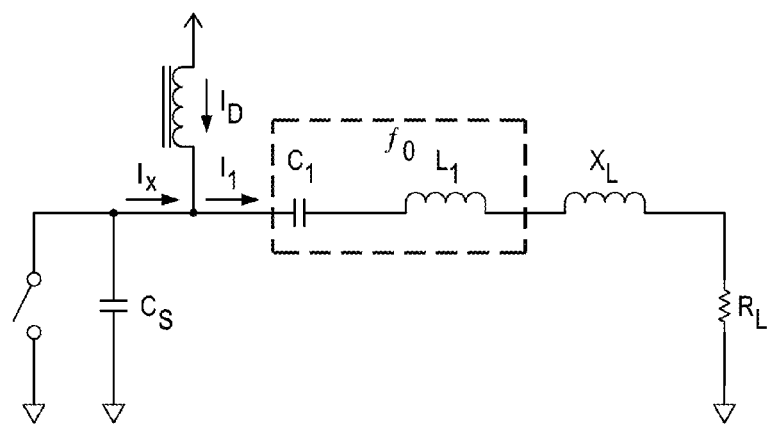
FIG. 2 shows an illustrative Class E power amplifier modeled as a switch, according to some embodiments of the disclosure.

Further improvements to power efficiency of a power amplifier are possible using Class E and F configurations where the power driving transistor is operated as a switch. FIG. 2 shows an illustrative Class E power amplifier modeled as a switch. A switch has low resistance impedance when closed and a high resistance when open. If the switch (i.e., the driving transistor) is turned on, the output voltage is near zero. Therefore maximum current flows through the switch with very little voltage across it. Conversely, if the switch is turned off, the output voltage is high. Therefore no or minimal current flows through the switch with high voltage across it. In both cases the switch power dissipation is minimal, optimizing efficiency.

Figure 3A:
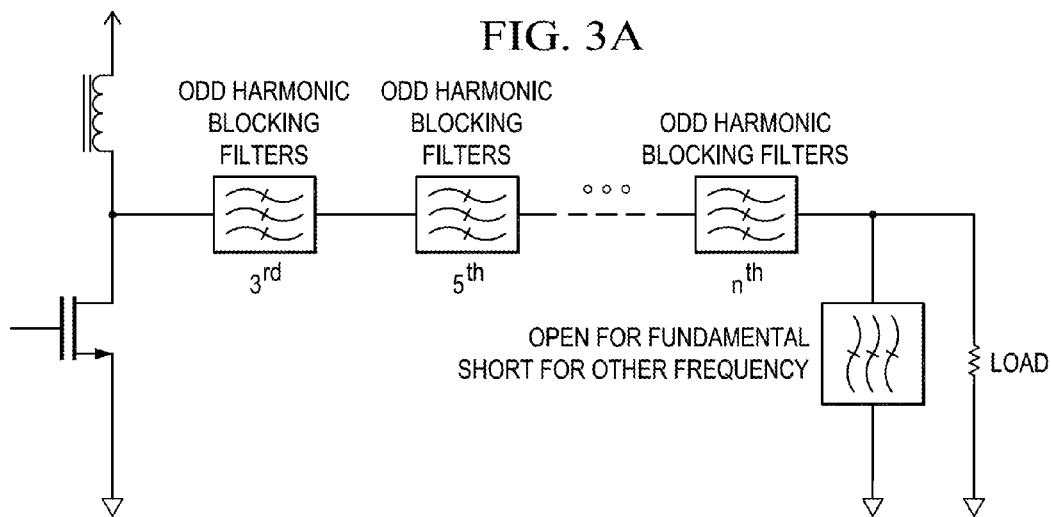
FIG. 3A shows an illustrative Class F power amplifier with odd harmonic blocking filters, according to some embodiments of the disclosure.
Figure 3B:
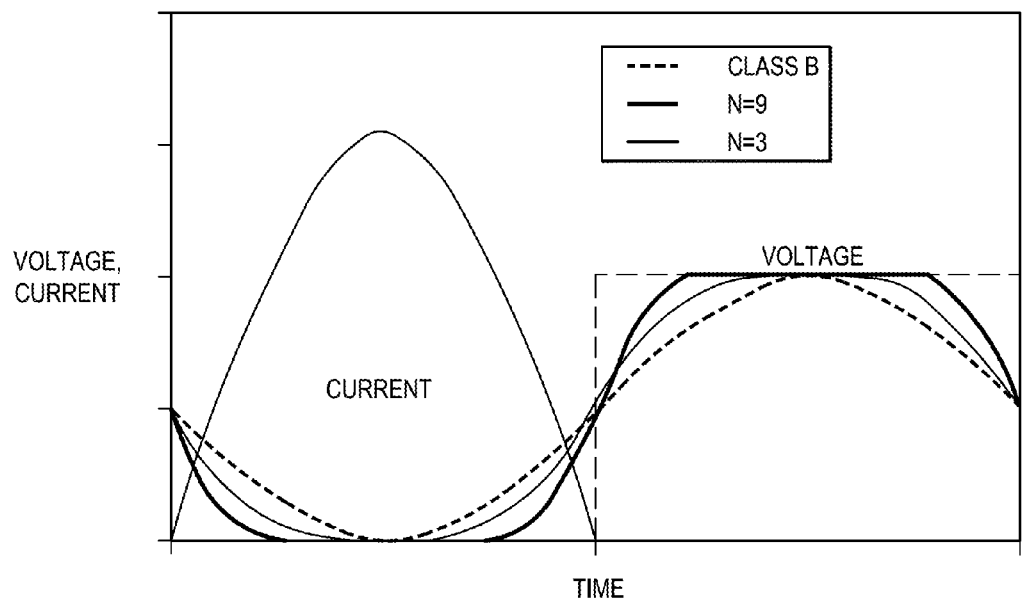
FIG. 3B shows illustrative voltage waveforms and an exemplary current waveform of a Class F power amplifier, according to some embodiments of the disclosure.

In practice, Class E amplifiers have power efficiency limitations due to the overlap of the current and voltage waveforms where the power is dissipated by the transistor. The lack of proper control over the current waveform may further exacerbate the power dissipation issue. Class F amplifiers can further improve on this overlap. FIG. 3A shows an illustrative Class F power amplifier with odd harmonic blocking filters, according to some embodiments of the disclosure. These illustrative harmonic blocking filters allow the voltage to assemble the square waveform to reduce the amount of overlap between the voltage and current waveforms. FIG. 3B shows illustrative voltage waveforms and an exemplary current waveform of a Class F power amplifier, according to some embodiments of the disclosure. By adding filters that block the odd harmonic from getting to the load, peaking back at the drain makes the waveform more square (e.g., flatter at the peak maximums and minimums of the waveform), reducing the voltage current waveform overlap and thereby improving power efficiency.

Example System for Driving the Power Amplifier and its Inefficacies

Figure 4:
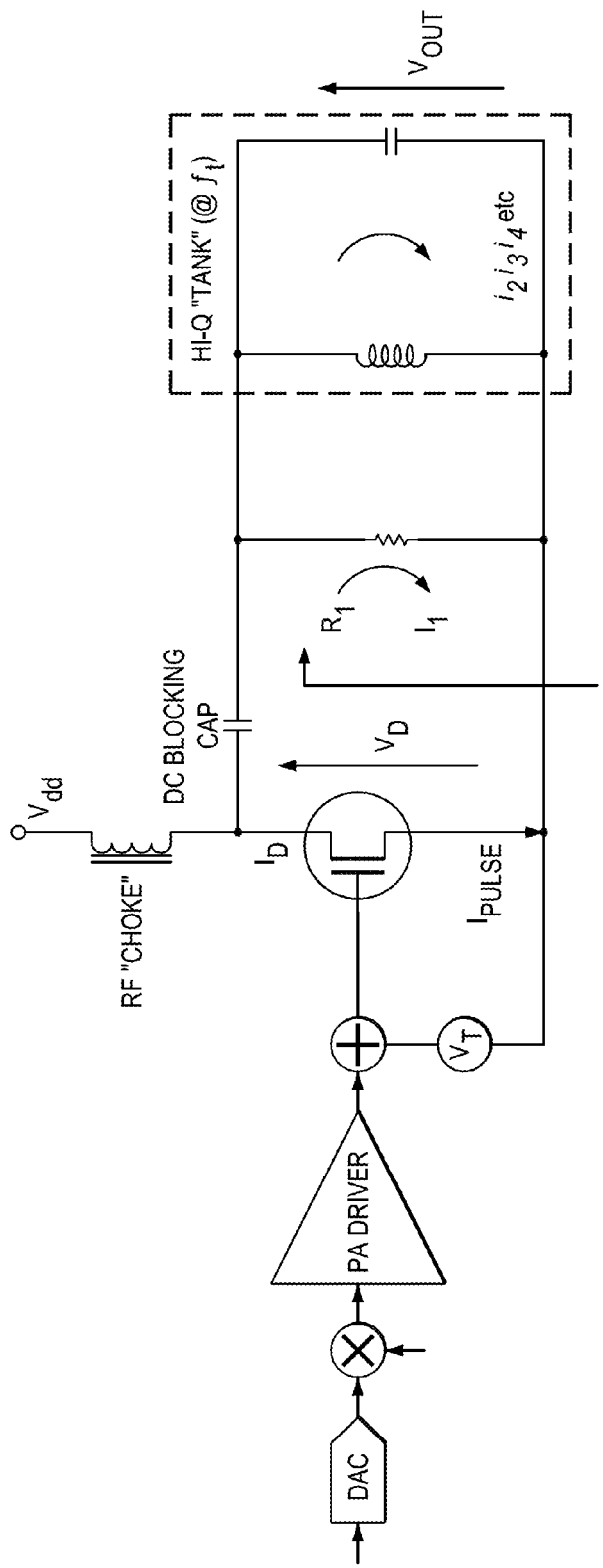
FIG. 4 shows a system for driving a power amplifier.

To drive a power amplifier with these waveforms, typically a high speed digital-to-analog converter (DAC) is used to drive the input of an amplifier configured in any of the variety of Classes of amplifiers. For instance, the DAC can be used to turn on the gate voltage of the switching transistor of the class F power amplifier, and hence the drain voltage is low and the current is highest for optimal power dissipation. FIG. 4 shows such a system for driving a power amplifier. The system requires an intermediate current to voltage conversion stage for the quadrature modulator interface. This requirement can increase the system complexity and inefficiency. Furthermore, having the current to voltage conversion increases the number of components and power consumption of the entire system.

Figure 5:
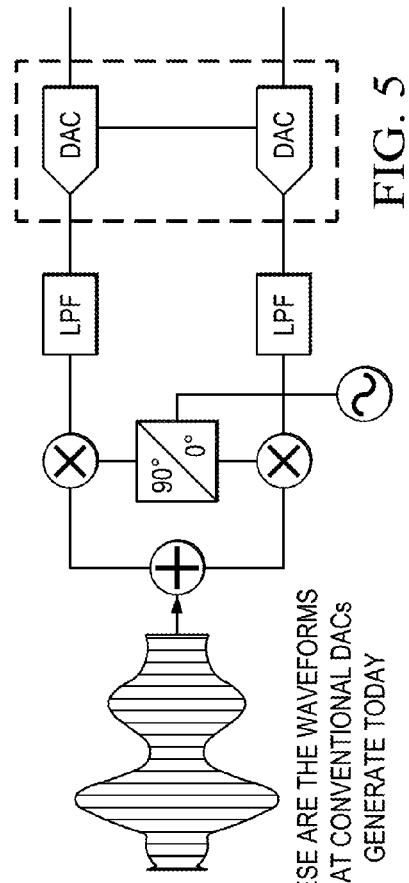
FIG. 5 shows illustrative waveforms which conventional digital-to-analog converters can generate.
Figure 6:
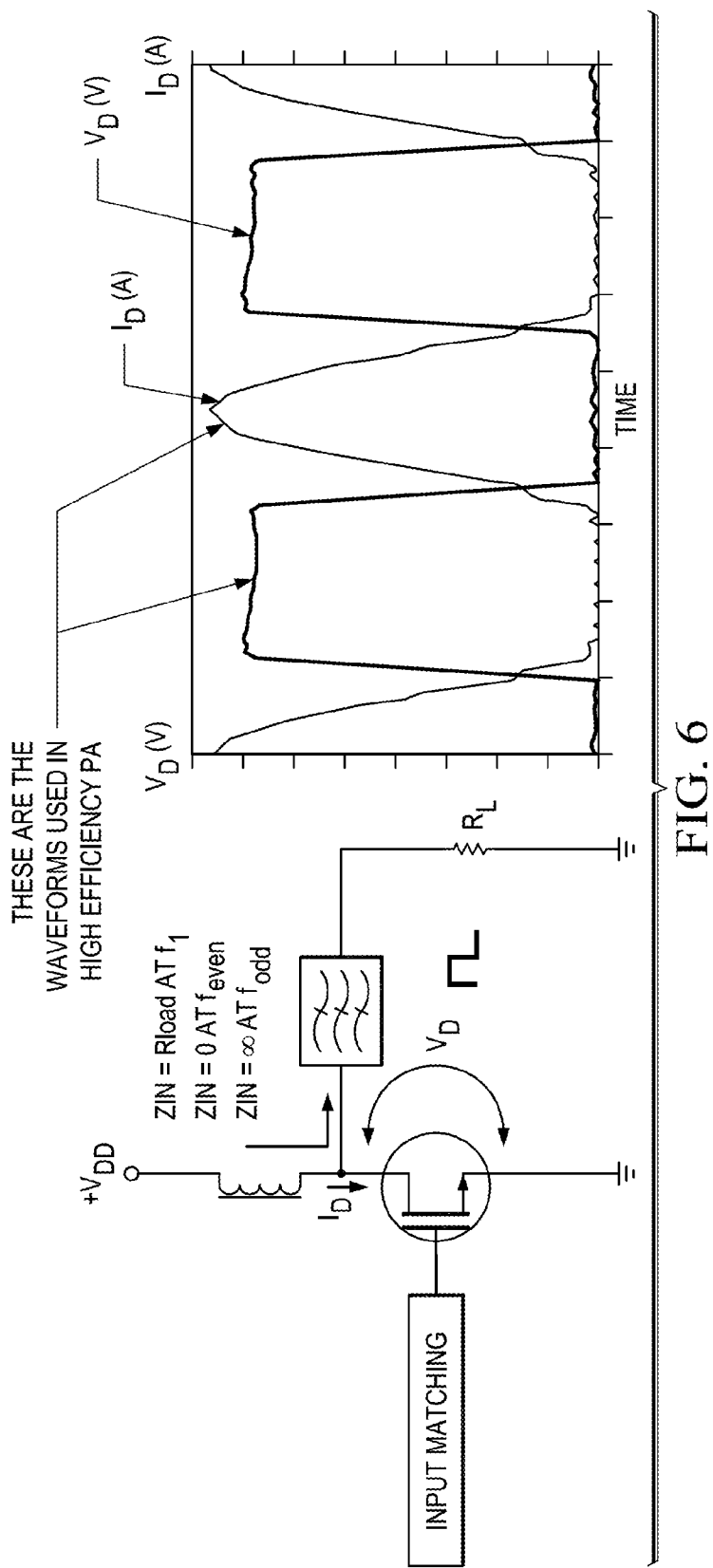
FIG. 6 shows illustrative waveforms used in a power efficient power amplifier, according to some embodiments of the disclosure.

Waveforms Generated by Digital-to-Analog Converters (DACs) and Shapes of Signal Waveforms FIG. 5 shows illustrative waveforms which conventional digital-to-analog converters (DACs) can generate. DACs typically drives spectrally pristine radio-frequency signals, depicted in FIG. 5, and the signals need to be reshaped to improve the power amplifier (PA) performance. FIG. 6 shows illustrative waveforms used in a power efficient power amplifier, according to some embodiments of the disclosure. The desirable signals driving a PA with high efficiency and linearity, depicted in FIG. 6, look very different than the signals that are produced by DACs in the existing system. The systems and methods of the present disclosure can efficiently bridge the gap/difference.

An Improved System: All Digital Zero-Voltage Switching (ZVS)

To provide the desirable signals and respective shapes of signal waveforms (as shown in FIG. 6), an all-digital ZVS system is used to simultaneously optimize PA linearity and efficiency while achieving large bandwidth. An all-digital ZVS system improves upon the transmit architecture shown in FIG. 4. Specifically, the improved solution provides full digital control over the shape of the current pulse into the power amplifier to optimize the power efficiency of the radio frequency conversion. Moreover, the improved solution involves a high efficiency power amplifier with digitally generated current output comprising current pulses from a digital-to-analog converter (DAC) to improve the efficiency of the RF conversion.

Figure 7:
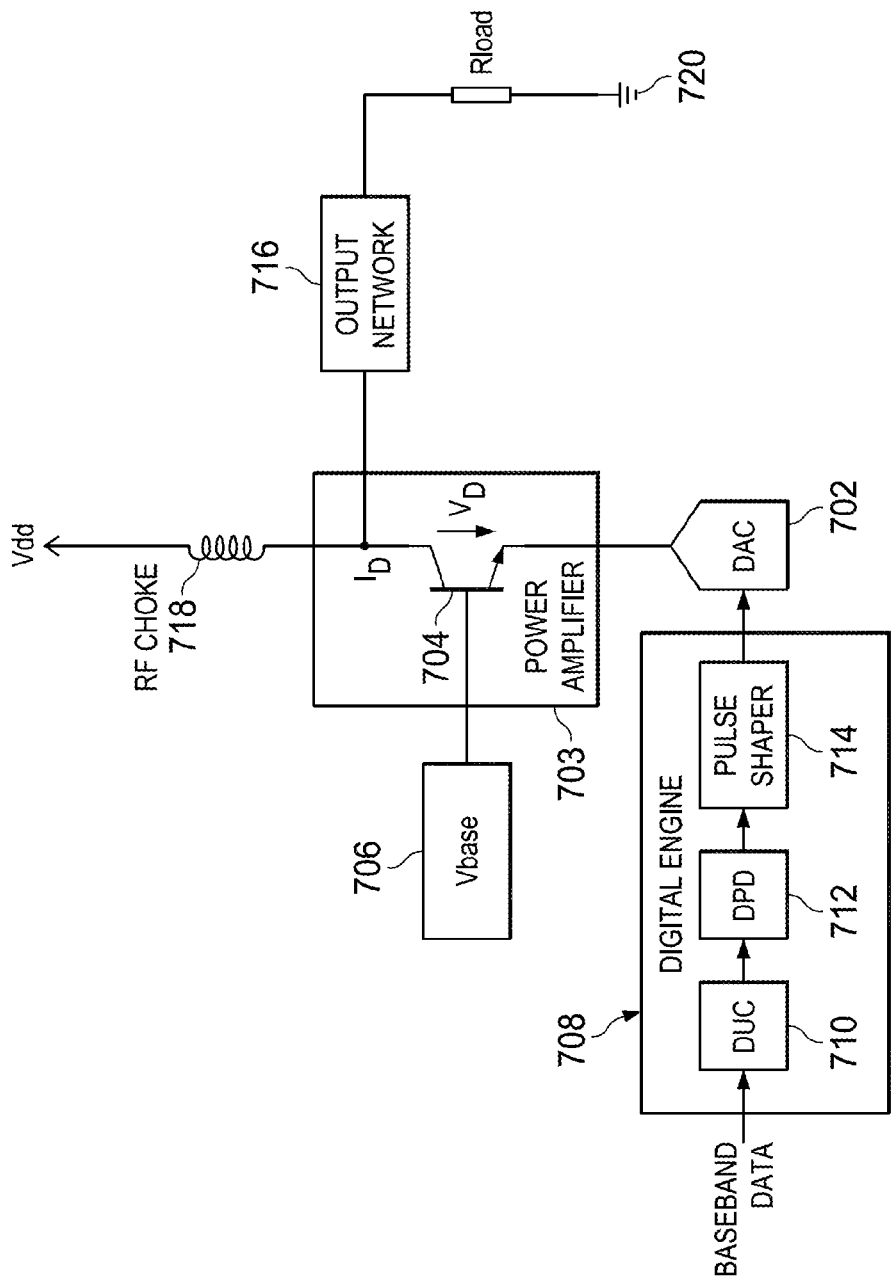
FIG. 7 shows an improved system for driving a power amplifier, according to some embodiments of the disclosure.
Figure 8:
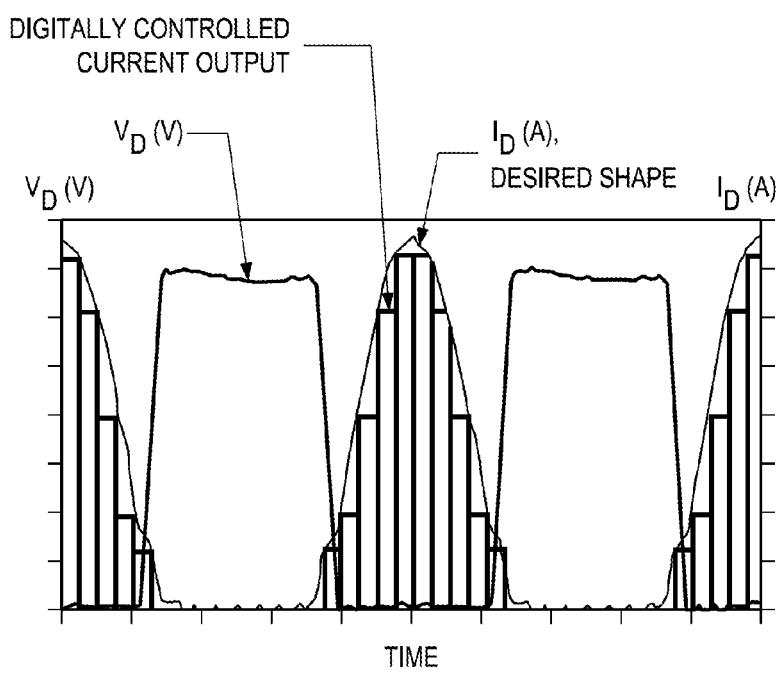
FIG. 8 shows illustrative voltage waveforms, an illustrative desired shape for the current waveform, and an illustrative digitally controlled current output, according to some embodiments of the disclosure.

FIG. 7 shows an improved system for driving a power amplifier, according to some embodiments of the disclosure. The system includes an apparatus which uses one or more digital to analog converters (DACs) 702 to optimize power efficiency of a switching power amplifier 703 through zero-voltage switching. As shown, the switching power amplifier 703 is modeled as a switch having driving transistor 704. Vbase 706 (e.g., a module for providing a base voltage, or referred herein as the base voltage generator) is connected to the base of the transistor 704, and the drain current is denoted as $I_D$ and the voltage across the transistor 704 is denoted as $V_D$. The desired signal waveforms for $I_D$ and $V_D$ in this system may correspond to exemplary waveforms of $I_D$ (A) and $V_D$ (V) of FIG. 6 (which is also shown in FIG. 8 in a later part of the present disclosure) for achieving zero-voltage switching to improve power efficiency.

The apparatus includes a DAC 702 having a digitally controlled current output driving the switching power amplifier 703, wherein the digitally controlled current output of the DAC 702 is connected to an emitter of a driving transistor 704 of the switching power amplifier 703. This configuration equates to a common base configuration for a bipolar transistor being used as the driving transistor, or equivalently, this configuration equates to a common gate configuration for a (Metal-Oxide-Semiconductor) field-effect transistor as the driving transistor (wherein the digitally controlled current output would be connected to the source of the driving transistor). By controlling the emitter current, the digitally controlled current output allows $I_D$ to be controlled as well. The DAC 702 operates at a high sample rate, e.g., in the gigahertz range, such that the desired current pulse shape of the emitter and collector current can be more accurately controlled. When the switching amplifier is on, the emitter/collector current is high and the voltage across the transistor is low, as a result, the power dissipation of the power amplifier can be minimized.

The apparatus further includes a digital engine 708 which receives a baseband signal input and provides a digital output driving an input of the DAC 702 for the DAC 702 to output a digitally controlled current output having a (desired) switching waveform. In other words, the DAC 702 is controlled by the digital output of the digital engine in order to allow the DAC to generate a suitable digitally controlled current output, i.e., shape the current output of the DAC to have a proper magnitude with respect to the voltage across the transistor 704 for improving power efficiency.

The resulting apparatus comprises a DAC 702 and a digital engine 708 (and any suitable components therein), which provide the all-digital control over the current flowing through the power amplifier, thereby providing an all-digital ZVS system. The all-digital ZVS system provides several advantages. One advantage includes eliminating the current to voltage conversion stage that is necessary in the conventional architecture. Effectively, the all-digital ZVS system allows the DAC 702 to drive the switching power amplifier (directly) in the absence of a current to voltage conversion stage. Using a DAC 702 to directly generate the signal that is desired in a high efficiency power amplifier removes the intermediate current to voltage conversion stage for the quadrature modulator interface. It reduces the interface inefficiency and the design complexity. It also reduces the power consumption and the component counts of the system and achieves higher integration level in the transmit signal chain. Another advantage results from using an all-digital engine for providing the digitally controlled signal output. To achieve higher power efficiency, it is critical to define the shape of current and voltage to minimize the overlap of the voltage and current in the power amplifier and therefore to minimize the power dissipation in the active device. Using a DAC 702 to digitally control the shape of the current pulses of the digitally controlled current output, more abrupt transitions at the transistor turn-on and turn-off are possible with more design flexibility. The accuracy of the representation of the current pulses may be affected by the DAC speed and resolution.

Desired Voltage Waveform, Current Waveform, and Switching Waveform

FIG. 8 shows illustrative voltage waveforms, an illustrative desired shape for the current waveform, and an illustrative digitally controlled current output, according to some embodiments of the disclosure. The illustrative voltage waveform $V_D$ (V) resembles the desired waveform for a Class F power amplifier. When the power amplifier is on, the voltage is zero (or close to zero) and the current is drawn from the emitter according to the desired shape of the current waveform $I_D$ (A). The bars shown according to the desired shape represents an exemplary set of current pulses (of a switching waveform) for the digitally controlled current output produced by the all-digital ZVS switching system of the present disclosure for improving power efficiency of the power amplifier. Specifically, the switching waveform comprises uniformly spaced current pulses having various magnitudes (e.g., to match a desired current waveform). The spacing of the pulses (e.g., the width of the pulses) depends on the speed of the DAC 702. In one example, the width of the pulses can be in the order of tens of picoseconds. The uniformly spaced current pulses comprises pulses having a magnitude according to a pulse shape (e.g., the pulse shape of the current waveform $I_D$ (A)) when the switching power amplifier is turned on and a voltage across the driving transistor is at a minimal level (e.g., $V_D$ (V) is below a low voltage threshold, near zero, and/or zero), and pulses having no magnitude (or close to zero) when the switching power amplifier is turned off (e.g., when $V_D$ (V) is high and/or above a low voltage threshold).

Digital Engine, Power Amplifier, Output Network, and Load for the Improved System Referring back to FIG. 7, the digital engine 708 may include one or more of the following: a digital up conversion (DUC) module 710, a digital pre-distortion (DPD) module 712, and a pulse shaper 714. While all three components are shown, its connections (e.g., manner of connecting the components) and selection of one or more of these components may vary depending on the application. For instance, a variation of the system may include the DPD module 712 before the DUC module 710 and the pulse shaper 714. A baseband signal passes through the components in the digital engine 708 and the output of the digital engine 708 is fed as input to the DAC 702 to drive the DAC 702. The digital engine 708 together with the DAC 702 drives the power amplifier 704 and controls the current shape.

The up conversion, DUC module 710, is done entirely in the digital domain and can take advantage of the advanced technology node, for example, 28 nm process, to reduce the system power consumption. It eliminates the phase-locked loop (PLL), Voltage Controlled Oscillator (VCO) and modulator from the signal chain and avoid problems present in zero intermediate frequency (ZIF) or complex intermediate frequency (CIF) architecture, like the quadrature error correction, and Local Oscillator (LO) feed through.

The DPD module 712 may compensate for the non-ideal performance caused by the non-linearities of the DAC and the (cascode) power amplifier. The inclusion of a DPD module further improves the efficiency of the power amplifier by running these components in their non-linear regions.

The pulse shaper 714 includes a wave shaping network. It can be an algorithm which takes the linear input signal and maps it to an output sequence which delivers the correct amount of energy to the output network. By doing this, the energy loss over the power transistor is kept at minimum.

The power amplifier 703 can be any of the switched-mode power amplifiers, for example, a class E or F configuration. The power amplifier may comprise a cascode stage in a common base configuration using high breakdown voltage compound semiconductor materials, and the digitally controlled current output from the DAC 702 has a current on the order of hundreds of milliamps (e.g., above 100 milliamps, between 100 milliamps to 512 milliamps, or more). With the cascode configuration, the emitter voltage can be kept low enough to not exceed the voltage tolerance of the advanced process the DAC may be built on. Using high breakdown voltage compound semiconductor materials such as GaN or GaAs, high collector voltages are possible allowing for the high current of the DAC (on the order of hundreds of milliamps) along with high collector voltage swings to generate large amounts of power from the power device. The power amplifier 703 can include a single structure or multiple parallel structures.

The output network 716 includes a matching network and any possible harmonic tuning networks to control the harmonic contents and resemble the square waveform of the collector voltage (such as one used in Class F operation). The apparatus may include one or more resonator output filters associated with a class F operation. The resonator output filter controls the harmonic content of the collector voltage and/or current, by shaping the waveforms to reduce the power dissipated on the active transistor 704. This in turn increases the-power amplifier efficiency.

The radio frequency choke 718 is connected between the power amplifier and the power supply to allow the DC current to flow through the transistor. Rload 720 represents the loading network. Rload 720 can be the actual load impedance, or possibly the impedance of the input-port of the filter following the power amplifier 716.

Figure 9:
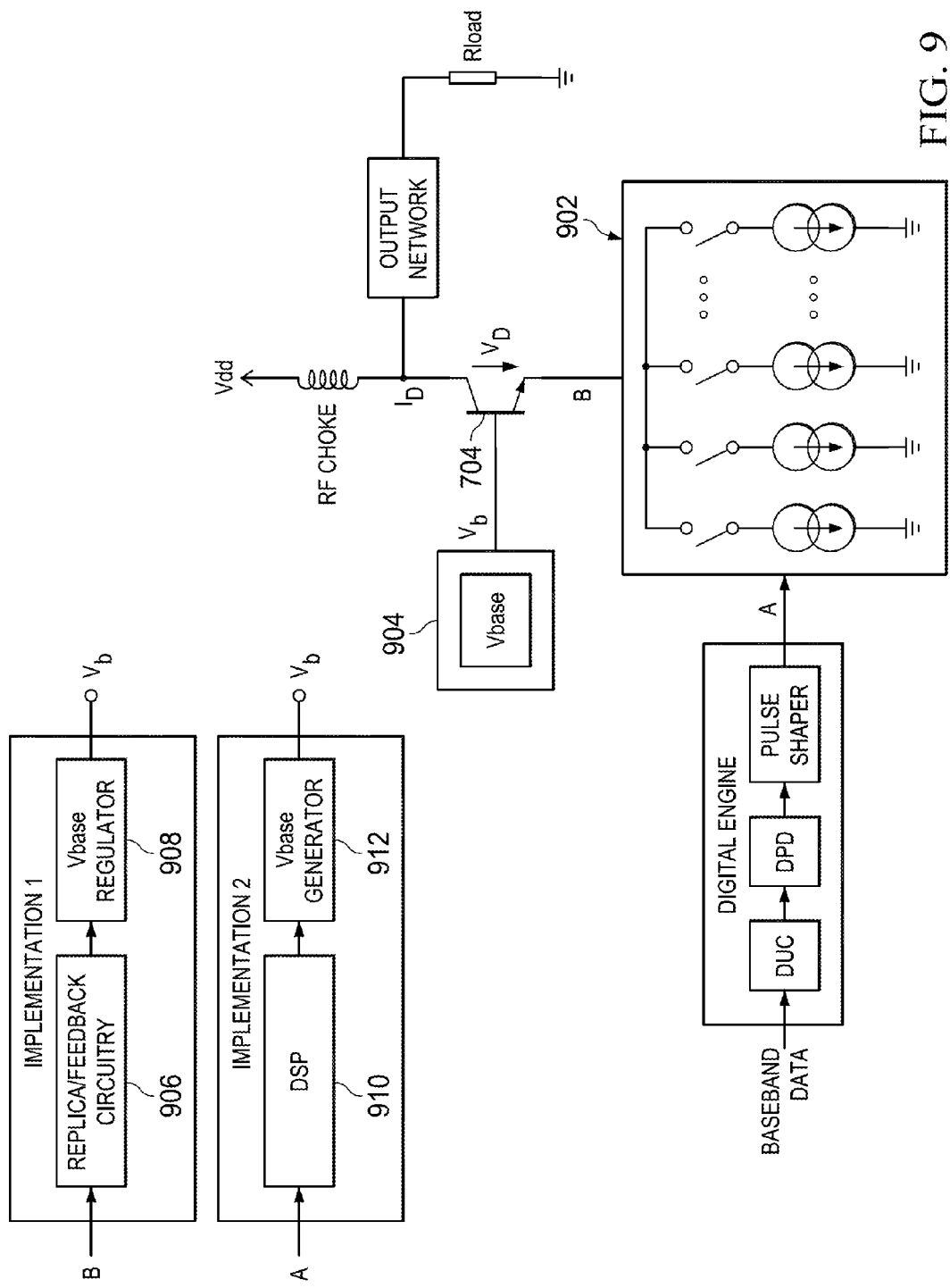
FIG. 9 shows exemplary implementations of an improved system for driving a power amplifier, according to some embodiments of the disclosure.

Exemplary Implementations of the Digital-to-Analog Converter for the Improved System Various implementations are possible for providing DAC 702 as seen in FIG. 7. FIG. 9 shows the implementation of an improved system for driving a power amplifier, according to some embodiments of the disclosure, where the DAC 902 can be implemented in different ways. For example, the DAC may include switch arrays, and output impedance control of switches in the switch arrays controls the magnitudes of the digitally controlled current output. In some examples, the DAC may include current source arrays configurable to provide varying magnitudes of the digitally controlled current output based on the digital output of the digital engine. In some examples, the DAC comprises resistor arrays configurable to provide varying magnitudes of the digitally controlled current output based on the digital output of the digital engine.

In some examples, the DAC comprises current source arrays and resistor arrays. The current source arrays convert most significant bits of the digital output signal (from the digital engine) and the resistor arrays convert least significant bits of the digital output signal (from the digital engine). They are combined to provide the digitally controlled current output of the DAC. In another example of a segmented DAC design, the DAC comprises switch arrays and resistor arrays.

Generally speaking, the DAC for producing precision current pulses to directly drive the driving transistor of the power amplifier should operate at a very high speed (in the gigahertz range) in order to extract the input modulation information accurately. For this reason, it is preferred that the DAC is implemented using current steering DACs, and not implemented with capacitor arrays which are far slower than current steering DACs.

In one embodiment, the DAC 702 can be implemented with parallel DAC structures, where the DAC structures are duplicated to achieve large output current. The DAC 702 may be a DAC system comprising four, six, or eight (or even more) parallel DAC cores. The same input word may be provided as the digital input signal to the parallel DAC cores, and the outputs from the DAC cores may be combined to provide an aggregate analog output having a current output on the order of hundreds of milliamps. The outputs of the DACs are amplified and combined in a cascode stage of the switching power amplifier 703. The cascode stage may include eight (or more) parallel cascodes directly connected to the eight parallel DAC cores. The cascode stage may include a power combining network to combine the output power at the outputs of the cascodes.

It is envisioned that a combination of these technologies can be used to provide the architecture of the DAC in a segmented design where certain bits of the input word is converted into an analog signal using one of these exemplary implementations, and other bits of the input word is converted into an analog signal using another one of these exemplary implementations.

Providing a Suitable Voltage Waveform at the Base/Gate of the Driving Transistor Besides providing a suitable current waveform, the driving transistor is also driven with a proper voltage waveform at the base of the driving transistor (or gate, if a field-effect transistor is used). An illustrative waveform for the voltage works in tandem with an illustrative waveform for the current (in some ways dependent on each other), as seen in FIG. 8, to provide zero-voltage switching. Referring back to FIG. 9, different implementations are possible for providing a base voltage generator 904 to provide a base voltage having the desired voltage waveform for the driving transistor. The base voltage generator (labeled as "Vbase") 904 bias circuitry can be implemented in various ways.

In some cases, the base voltage generator 904 can use a Vbase regulator 908 to provide the base voltage. The Vbase regulator 908 closes the loop with a replica module 906 (or feedback current branch) mirrored from the main current path B. In this example, the base voltage generator comprises a replica module 906 connected to the digitally controlled current output of the DAC, for mirroring the digitally controlled current output, and a voltage regulator (Vbase regulator 908), connected to the output of the replica module, for generating a base voltage according to the voltage waveform based on the output of the replica module.

In some cases, the signal processed by the digital engine (of signal path A) can go through a digital signal processor (DSP) 910 (having some suitable DSP functions) and drive a Vbase generator 912 to provide the gate control signals. In this case, the input modulation information presents in both the DAC current and the Vbase voltage at the same time. The base voltage generator can include a digital signal processor 910 connected the digital output of the digital engine for processing the digital output to generate voltage information according to the voltage waveform at the output of the digital signal processor, and a voltage generator (Vbase generator 912), connected to the output of the digital signal processor module, for generating the base voltage based on the voltage information.

An Improved System: Multi-Carrier Transmitter

Wide dynamic range and excellent linearity are typical requirements for DACs to be used in multi-carrier scenarios at high frequency. In these scenarios, the signal generation circuitry, i.e., a DAC, and the power amplification circuitry, i.e., the power amplifier, are integrated together to achieve high output drive capability and boost the dynamic range. At the same time, frequency domain or time domain build-in DPD can be applied to improve the linearity of the system. As a result, the improved system is advantageous in constructing the multi-carrier transmitter.

Figure 10:
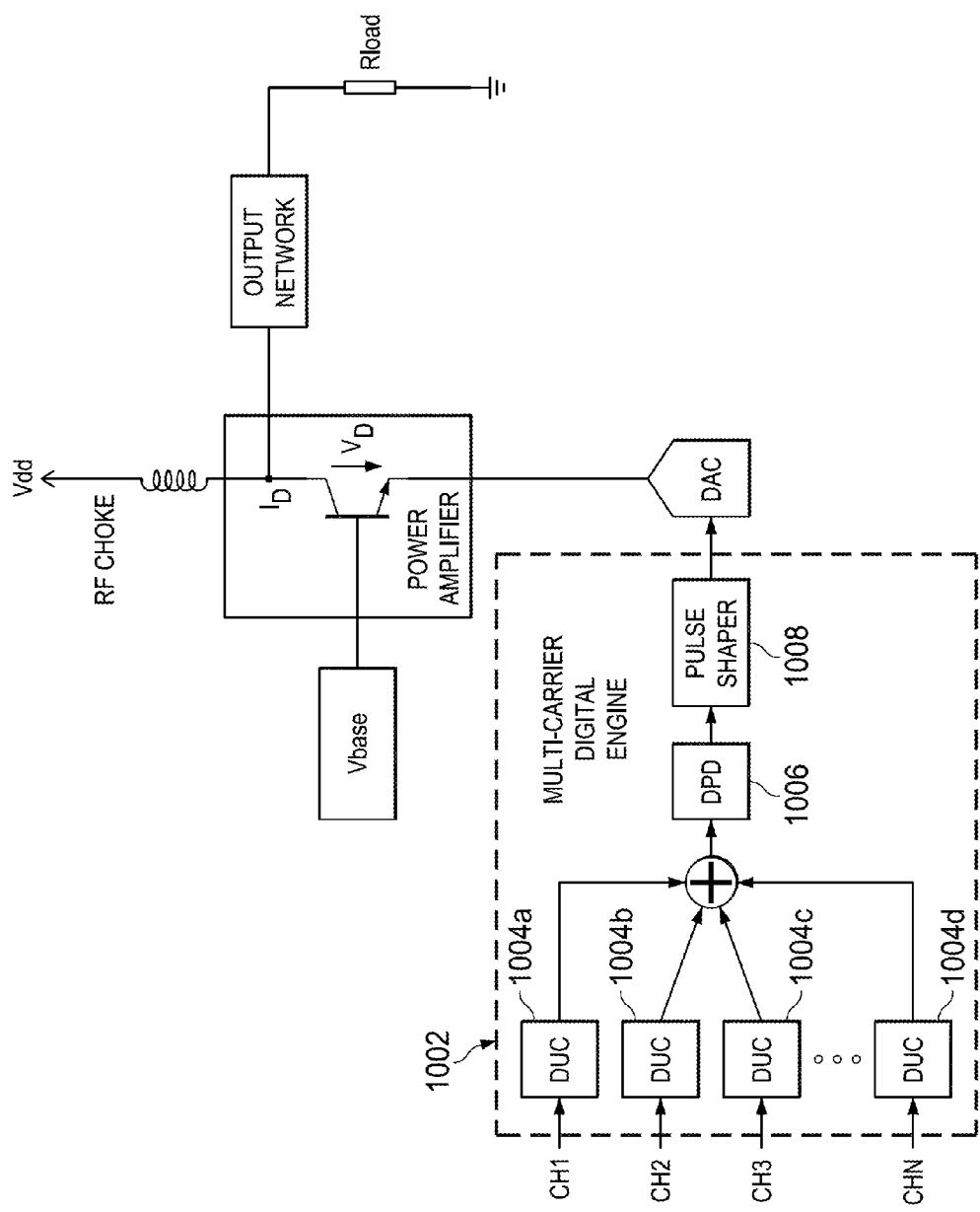
FIG. 10 shows an exemplary implementation of an improved system for driving a power amplifier, according to some embodiments of the disclosure.

FIG. 10 depicts a multi-carrier digital engine 1002 as part of an exemplary implementation of an improved system for driving a power amplifier. The digital frequency tuning ability in the multiple digital up-conversion blocks (e.g., DUC 1004*a*, 1004*b*, 1004*c*, and 1004*d*, and could have more depending on the number of channels) mix the individual carriers at different frequencies and the digital intermediate frequencies are summed together (e.g., through a summation node) to generate the multi-carrier signal. After having the multi-carrier signal go through DPD 1006 and pulse shaper 1008, the output signal of the multi-carrier digital engine 1002 then goes through a single DAC/power amplifier system to generate the desired output signal. In this system, one single transmitter is able to the replace multiple single-carrier transmitters. It simplifies the system design, greatly reduces the power consumption, and provides tremendous design flexibility.

An Improved Method: All-Digital ZVS

Figure 11:
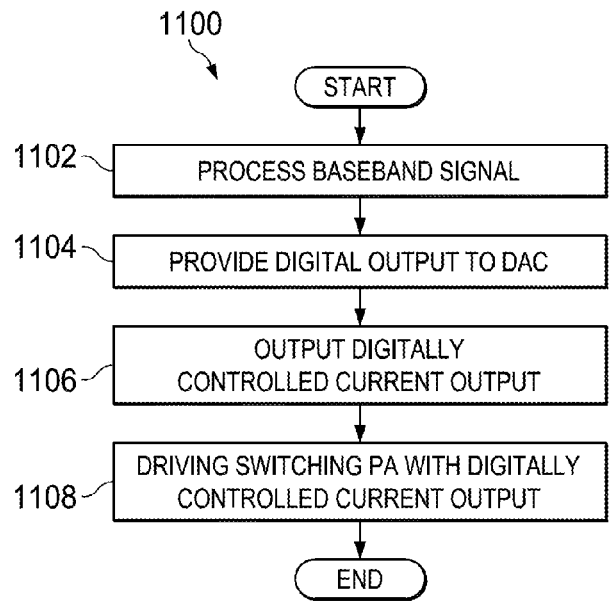
FIG. 11 shows an exemplary flow diagram illustrating a method for using one or more digital to analog converters (DACs) to optimize power efficiency of the switching power amplifier through zero-voltage switching, according to some embodiments of the disclosure.

FIG. 11 shows an exemplary flow diagram illustrating a method for using one or more digital to analog converters (DACs) to optimize power efficiency of the switching power amplifier through zero-voltage switching, according to some embodiments of the disclosure. The method 1100 comprises processing a baseband signal as input by a digital engine (box 1102), providing a digital output of the digital engine to drive an input of the DAC (box 1104), outputting, by the DAC, a digitally controlled current output having a switching waveform (box 1106), driving the switching power amplifier directly with the digitally controlled current output of the DAC (box 1108). The digitally controlled current output of the DAC is connected to an emitter of a driving transistor of the switching power amplifier.

In particular, the switching waveform of the digitally controlled current output (related to box 1106 and 1108) comprises uniformly spaced current pulses having various magnitudes (e.g., the magnitudes being provided according to a desired current waveform). Furthermore, outputting, by the DAC, the digitally controlled current output (box 1106) may comprise outputting pulses having a magnitude according to a pulse shape when the switching power amplifier is turned on and a voltage across the driving transistor is at a minimal level and outputting pulses having little to no magnitude when the switching power amplifier is turned off.

In some cases, outputting, by the DAC, the digitally controlled current output (box 1106) comprises outputting a current on the order of hundreds of milliamps to the power amplifier comprising a cascode stage in a common base configuration using high breakdown voltage compound semiconductor materials.

In some cases, processing the baseband signal by the digital engine comprises filtering the baseband signal through one or more of the following: a digital up conversion module, a digital pre-distortion module, and a pulse shaper.

In some cases, driving the switching power amplifier directly with the digitally controlled current output (box 1108) comprises driving the switching power amplifier using the digitally controlled current output in the absence of a current to voltage conversion stage.

Example Transmitters Having an Improved ZVS System

Figure 12:
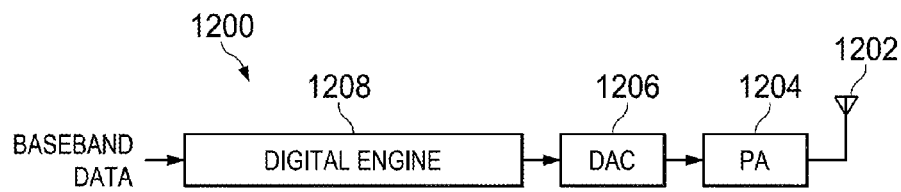
FIG. 12 shows an exemplary transmitter system having an improved system for driving a power amplifier, according to some embodiments of the disclosure.

FIG. 12 shows an exemplary transmitter system 1200 having an improved system for driving a power amplifier, according to some embodiments of the disclosure. The transmitter having antenna 1202 may further include the improved system. The improved system includes a switching power amplifier 1204. Furthermore, the improved system includes a digital to analog converter 1206 having a digitally controlled current output driving the switching power amplifier, wherein the digitally controlled current output of the DAC 1206 is connected to an emitter of a driving transistor of the (switching) power amplifier 1204. Moreover, the improved system includes a digital engine 1208 receiving a baseband signal input and providing a digital output driving an input of the DAC 1204. The DAC outputs the digitally controlled current output having a switching waveform, based on the digital output driving the input of the DAC. The output signal produced by the power amplifier 1204 is provided to the antenna 1202 for transmission.

In the wireless infrastructure market, there have been constant battles in order to increase the dynamic range and frequency range of the transmitter. The proposed methods and systems brings the technology one step further towards the Bit2RF system, which directly translates the digital bits to the radio frequency signal in the transmit path. It simultaneously achieves higher output drive capability, wider frequency range, and higher power efficiency. It can be especially suitable in the distributed antenna system networks, i.e., the active antenna and small cell systems.

Figure 13:
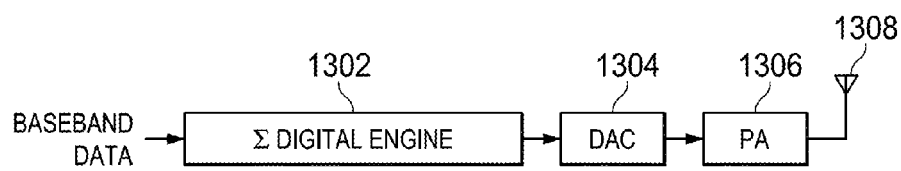
FIG. 13 shows an exemplary transmitter system having an improved system for driving a power amplifier, according the some embodiments of the disclosure.

FIG. 13 shows yet another exemplary transmitter system having an improved system for driving a power amplifier. Namely, the improved system has a multi-carrier digital engine 1302, a variant of the digital engine. As previously discussed in relation to FIG. 10, the improved systems and methods can work particularly well in multi-carrier scenarios at high frequency. Using the implementation shown in FIG. 10, a single transmitter is able to the replace multiple single-carrier transmitters. It simplifies the system design, greatly reduces the power consumption, and provides tremendous design flexibility.

As shown in FIG. 13, the improved transmitter system includes the multi-carrier digital engine 1302, a digital to analog converter (DAC) 1304, a (switching) power amplifier 1306, and an antenna 1308. The DAC 1304 has a digitally controlled current output driving the (switching) power amplifier 1306, wherein the digitally controlled current output of the DAC 1304 is connected to an emitter of a driving transistor of the switching power amplifier 1306. Moreover, the improved system includes the multi-carrier digital engine 1302 receiving a baseband signal input and providing a digital output driving an input of the DAC 1304. The DAC outputs the digitally controlled current output having a switching waveform based on the digital output driving the input of the DAC 1304. The output signal produced by the power amplifier 1306 is provided to the antenna 1308 for transmission.

The multi-carrier digital engine 1302 can be implemented the same way as shown in FIG. 10. For instance, the digital engine may include one or more of the following: a plurality of digital up conversion blocks, each of the digital up conversion blocks for mixing individual carriers at different frequencies to generate digital intermediate frequencies, a summation node for summing the digital intermediate frequencies to generate a multi-carrier signal, a digital pre-distortion module taking the multi-carrier signal as input for generating a pre-distorted signal, and a pulse shaper taking pre-distorted signal as input to generate the digital output of the digital engine.

Exemplary Implementations and Variations

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure. The choice of transistors and current sinking vs current sourcing DACs illustrated here are not meant to limit the choice of circuit topology.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

In certain contexts, the features discussed herein can be applicable to radio frequency wireless communications, radar, audio and video equipment, base stations, transmitters, and other digital-processing-based systems which may benefit from a power efficient power amplifier driven directly by a DAC.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Note that all optional features of the apparatus described above may also be implemented with respect to the method or process described herein and specifics in the examples may be used anywhere in one or more embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes, Examples, and Implementations

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

EXAMPLES

Example 1 is an apparatus for using one or more digital to analog converters (DACs) to optimize power efficiency of a switching power amplifier through zero-voltage switching, comprising a DAC having a digitally controlled current output driving the switching power amplifier, wherein the digitally controlled current output of the DAC is connected to an emitter of a driving transistor of the switching power amplifier; and a digital engine receiving a baseband signal input and providing a digital output driving an input of the DAC for the DAC to output a digitally controlled current output having a switching waveform.

In Example 2, the subject matter of Example 1 can optionally include the switching waveform comprising uniformly spaced current pulses having various magnitudes, wherein the uniformly spaced current pulses comprises: pulses having a magnitude according to a pulse shape when the switching power amplifier is turned on and a voltage across the driving transistor is at a minimal level; and pulses having little to no magnitude when the switching power amplifier is turned off.

In Example 3, the subject matter of any of Examples 1-2 can optionally include the power amplifier comprising a cascode stage in a common base configuration using high breakdown voltage compound semiconductor materials; and the digitally controlled current output has a current on the order of hundreds of milliamps.

In Example 4, the subject matter of any one of Examples 1-3 can optionally include the switching power amplifier including an amplifier having a class E or F configuration.

In Example 5, the subject matter of any one of Examples 1-4 can optionally include one or more resonator output filters associated with a class F operation, wherein a voltage waveform at the collector approaches a square waveform to reduce additional power dissipation.

In Example 6, the subject matter of any one of Examples 1-6 can optionally include the DAC comprising switch arrays, and output impedance control of switches in the switch arrays controls the magnitudes of the digitally controlled current output.

In Example 7, the subject matter of any one of Examples 1-6 can optionally include the DAC comprising resistor arrays configurable to provide varying magnitudes of the digitally controlled current output based on the digital output of the digital engine.

In Example 8, the subject matter of any one of Examples 1-7 can optionally include the DAC driving the switching power amplifier using the digitally controlled current output in the absence of a current to voltage conversion stage.

In Example 9, the subject matter of any one of Examples 1-8 can optionally include a base voltage generator to provide a base voltage for the driving transistor having a voltage waveform, wherein the base voltage generator comprises: a replica module connected to the digitally controlled current output of the DAC, for mirroring the digitally controlled current output; and a voltage regulator, connected to the output of the replica module, for generating a base voltage according to the voltage waveform based on the output of the replica module.

In Example 10, the subject matter of any one of Examples 1-9 can optionally include a base voltage generator to provide a base voltage having a voltage waveform, wherein the base voltage generator comprises: a digital signal processor connected the digital output of the digital engine for processing the digital output to generate voltage information according to the voltage waveform at the output of the digital signal processor; and a voltage generator, connected to the output of the digital signal processor, for generating the base voltage based on the voltage information.

In Example 11, the subject matter of any one of Examples 1-10 can optionally include the digital engine comprising one or more of the following: a digital up conversion module, a digital pre-distortion module, and a pulse shaper.

In Example 12, the subject matter of any one of Examples 1-11 can optionally include the digital engine comprising: a plurality of digital up conversion blocks, each of the digital up conversion blocks for mixing individual carriers at different frequencies to generate digital intermediate frequencies.

In Example 13, the subject matter of Example 12 can optionally include the digital engine further comprising a summation node for summing the digital intermediate frequencies to generate a multi-carrier signal.

In Example 14, the subject matter of Example 14 can optionally include the digital engine further comprising a digital pre-distortion module taking the multi-carrier signal as input for generating a pre-distorted signal; and a pulse shaper taking pre-distorted signal as input to generate the digital output of the digital engine.

Example 15 is a method for using one or more digital to analog converters (DACs) to optimize power efficiency of the switching power amplifier through zero-voltage switching, comprising: processing a baseband signal as input by a digital engine; providing a digital output of the digital engine to drive an input of the DAC; outputting, by the DAC, a digitally controlled current output having a switching waveform; and driving the switching power amplifier directly with the digitally controlled current output of the DAC, wherein the digitally controlled current output of the DAC is connected to an emitter of a driving transistor of the switching power amplifier.

In Example 16, the subject matter of Example 15 can optionally include the switching waveform comprising uniformly spaced current pulses having various magnitudes; outputting, by the DAC, the digitally controlled current output comprising: outputting pulses having a magnitude according to a pulse shape when the switching power amplifier is turned on and a voltage across the driving transistor is at a minimal level; and outputting pulses having little to no magnitude when the switching power amplifier is turned off.

In Example 17, the subject matter of any one of Examples 15-16 can optionally include outputting, by the DAC, the digitally controlled current output comprising outputting a current on the order of hundreds of milliamps to the power amplifier comprising a cascode stage in a common base configuration using high breakdown voltage compound semiconductor materials.

In Example 18, the subject matter of any one of Examples 15-17 can optionally include driving the switching power amplifier directly with the digitally controlled current output comprises driving the switching power amplifier using the digitally controlled current output in the absence of a current to voltage conversion stage.

In Example 19, the subject matter of any one of Examples 15-18 can optionally include providing a base voltage having a voltage waveform at the base of the switching transistor, wherein the providing of the voltage having a voltage transform comprises: mirroring the digitally controlled current output using a replica module connected to the digitally controlled current output of the DAC; and generating the base voltage according to the voltage waveform based on the output of the replica module using a voltage regulator connected to the output of the replica module.

In Example 20, the subject matter of anyone of Examples 15-18 can optionally include providing a base voltage having a voltage waveform at the base of the switching transistor, wherein the providing of the voltage having a voltage transform comprises: processing the digital output to generate voltage information according to the voltage waveform at the output of a digital signal processor using the digital signal processor connected the digital output of the digital engine; and generating the base voltage based on the voltage information using a voltage generator connected to the output of the digital signal processor.

Example 21 is a radio frequency transmitter system for driving an antenna, said antenna configured to transmitting radio frequency signals, comprising: a switching power amplifier for producing the radio frequency signals to be transmitted by the antenna; a digital to analog converter having a digitally controlled current output driving the switching power amplifier, wherein the digitally controlled current output of the DAC is connected to an emitter of a driving transistor of the switching power amplifier; and a digital engine receiving a baseband signal input and providing a digital output driving an input of the DAC, wherein the DAC outputs the digitally controlled current output having a switching waveform based on the digital output driving the input of the DAC.

In Example 22, the subject matter of Example 21 can optionally include the digital engine comprising: a plurality of digital up conversion blocks, each of the digital up conversion blocks for mixing individual carriers at different frequencies to generate digital intermediate frequencies; a summation node for summing the digital intermediate frequencies to generate a multi-carrier signal; a digital pre-distortion module taking the multi-carrier signal as input for generating a pre-distorted signal; and a pulse shaper taking pre-distorted signal as input to generate the digital output of the digital engine.

Example 23 is an apparatus for using one or more digital to analog converters (DACs) to optimize power efficiency of a switching power amplifier through zero-voltage switching, the apparatus comprising: means for processing a baseband signal as input by a digital engine; means for providing a digital output of the digital engine to drive an input of the DAC; means for outputting, by the DAC, a digitally controlled current output having a switching waveform; and means for driving the switching power amplifier directly with the digitally controlled current output of the DAC, wherein the digitally controlled current output of the DAC is connected to an emitter of a driving transistor of the switching power amplifier.

Example 24 is an apparatus for using one or more digital to analog converters (DACs) to optimize power efficiency of a switching power amplifier through zero-voltage switching, the apparatus comprising means for performing the method described in any one of the Examples 16-18.

In Example 25, the subject matter of any one of the Examples 24 can optionally include the apparatus being a computing device.

What is claimed is:

1. An apparatus for using one or more digital to analog converters (DACs) to optimize power efficiency of a switching power amplifier through zero-voltage switching, comprising:
   a digital engine configured to receive a baseband signal input, up convert the baseband signal using a digital up converter in the digital engine, and output a radio frequency (RF) digital output for driving an input of a DAC; and
   a DAC configured to receive the RF digital output from the digital engine to generate a digitally controlled current output having a switching waveform, wherein the digitally controlled current output is connected to an emitter of a driving transistor of the switching power amplifier to provide zero-voltage switching for the switching power amplifier.

2. The apparatus of claim 1, wherein the switching waveform comprises uniformly spaced current pulses having various magnitudes, wherein the uniformly spaced current pulses comprises:
   pulses having a magnitude according to a pulse shape when the switching power amplifier is turned on and a voltage across the driving transistor is at a minimal level; and
   pulses having little to no magnitude when the switching power amplifier is turned off.

3. The apparatus of claim 1, wherein:
   the power amplifier comprises a cascode stage in a common base configuration using high breakdown voltage compound semiconductor materials; and
   the digitally controlled current output has a current on the order of hundreds of milliamps.

4. The apparatus of claim 1, wherein the switching power amplifier includes an amplifier having a class E or F configuration.

5. The apparatus of claim 1, further comprising:
   one or more resonator output filters associated with a class F operation, wherein a voltage waveform at the collector approaches a square waveform to reduce additional power dissipation.

6. The apparatus of claim 1, wherein the DAC comprises switch arrays, and output impedance control of switches in the switch arrays controls the magnitudes of the digitally controlled current output.

7. The apparatus of claim 1, wherein the DAC comprises resistor arrays configurable to provide varying magnitudes of the digitally controlled current output based on the digital output of the digital engine.

8. The apparatus of claim 1, wherein the DAC drives the switching power amplifier using the digitally controlled current output in the absence of a current to voltage conversion stage.

9. The apparatus of claim 1, further comprising a base voltage generator to provide a base voltage for the driving transistor having a voltage waveform, wherein the base voltage generator comprises:
   a replica circuit connected to the digitally controlled current output of the DAC, for mirroring the digitally controlled current output; and
   a voltage regulator, connected to the output of the replica circuit, for generating a base voltage according to the voltage waveform based on the output of the replica circuit.

10. The apparatus of claim 1, further comprising a base voltage generator to provide a base voltage having a voltage waveform, wherein the base voltage generator comprises:
    a digital signal processor connected the RF digital output of the digital engine for processing the RF digital output to generate voltage information according to the voltage waveform at the output of the digital signal processor; and
    a voltage generator, connected to the output of the digital signal processor, for generating the base voltage based on the voltage information.

11. The apparatus of claim 1, wherein the digital engine comprises: the digital up converter, a digital pre-distorter, and a pulse shaper.

12. The apparatus of claim 1, wherein the digital engine comprises:
    a plurality of digital up converters, each of the digital up conversion blocks for mixing individual carriers at different frequencies to generate digital intermediate frequencies.

13. The apparatus of claim 12, wherein the digital engine further comprises:
    a summation node for summing the digital intermediate frequencies to generate a multi-carrier signal.

14. The apparatus of claim 13, wherein the digital engine further comprises:
    a digital pre-distorter taking the multi-carrier signal as input for generating a pre-distorted signal; and
    a pulse shaper taking pre-distorted signal as input to generate the RF digital output of the digital engine.

15. A method for using one or more digital to analog converters (DACs) to optimize power efficiency of the switching power amplifier through zero-voltage switching, comprising:
    processing a baseband signal as input by a digital engine;
    up converting, by a digital up converter in the digital engine, the baseband signal in the digital domain;
    outputting a radio frequency (RF) digital output of the digital engine to drive an input of the DAC;
    outputting, by the DAC, a digitally controlled current output having a switching waveform based on the RF digital output of the digital engine; and
    driving the switching power amplifier directly with the digitally controlled current output of the DAC, wherein the digitally controlled current output of the DAC is connected to an emitter of a driving transistor of the switching power amplifier to provide zero-voltage switching for the switching power amplifier.

16. The method of claim 15, wherein:
    the switching waveform comprises uniformly spaced current pulses having various magnitudes;
    outputting, by the DAC, the digitally controlled current output comprises:
       outputting pulses having a magnitude according to a pulse shape when the switching power amplifier is turned on and a voltage across the driving transistor is at a minimal level; and
       outputting pulses having little to no magnitude when the switching power amplifier is turned off.

17. The method of claim 15, wherein outputting, by the DAC, the digitally controlled current output comprises outputting a current on the order of hundreds of milliamps to the power amplifier comprising a cascode stage in a common base configuration using high breakdown voltage compound semiconductor materials.

18. The method of claim 15, wherein driving the switching power amplifier directly with the digitally controlled current output comprises driving the switching power amplifier using the digitally controlled current output in the absence of a current to voltage conversion stage.

19. A radio frequency transmitter system for driving an antenna, said antenna configured to transmitting radio frequency signals, comprising:
- a switching power amplifier for producing the radio frequency (RF) signals to be transmitted by the antenna;
- a digital engine configured to receive a baseband signal input, up convert the baseband signal using a digital up converter in the digital engine, and output a RF digital output for driving an input of a DAC; and
- the digital to analog converter (DAC) configured to receive the RF digital output to generate a digitally controlled current output having a switching waveform, wherein the digitally controlled current output drives an emitter of a driving transistor of the switching power amplifier to provide zero-voltage switching for the switching power amplifier.

20. The radio frequency transmitter system of claim 19, wherein the digital engine comprises:
- a plurality of digital up converters, each of the digital up conversion blocks for mixing individual carriers at different frequencies to generate digital intermediate frequencies;
- a summation node for summing the digital intermediate frequencies to generate a multi-carrier signal;
- a digital pre-distorter taking the multi-carrier signal as input for generating a pre-distorted signal; and
- a pulse shaper taking pre-distorted signal as input to generate the RF digital output of the digital engine.

* * * * *

UNITED STATES PATENT AND TRADEMARK OFFICE
CERTIFICATE OF CORRECTION

PATENT NO. : 9,281,788 B2
APPLICATION NO. : 14/201845
DATED : March 8, 2016
INVENTOR(S) : Bernd Schafferer et al.

It is certified that error appears in the above-identified patent and that said Letters Patent is hereby corrected as shown below:

In The Claims in Line 31 of Column 1: delete "Overview" and insert -- "OVERVIEW" -- therefor.

Signed and Sealed this
Twenty-first Day of June, 2016

Michelle K. Lee
*Director of the United States Patent and Trademark Office*

UNITED STATES PATENT AND TRADEMARK OFFICE
CERTIFICATE OF CORRECTION

Page 1 of 1

PATENT NO. : 9,281,788 B2
APPLICATION NO. : 14/201845
DATED : March 8, 2016
INVENTOR(S) : Bernd Schafferer et al.

It is certified that error appears in the above-identified patent and that said Letters Patent is hereby corrected as shown below:

In The Specification in Line 31 of Column 1: delete "Overview" and insert -- "OVERVIEW" -- therefor.

This certificate supersedes the Certificate of Correction issued June 21, 2016.

Signed and Sealed this
Ninth Day of August, 2016

Michelle K. Lee
*Director of the United States Patent and Trademark Office*